(12) United States Patent
Tomita et al.

(10) Patent No.: US 11,060,887 B2
(45) Date of Patent: Jul. 13, 2021

(54) MAGNETIC DETECTION SENSOR, ROTATION DETECTION SENSOR, AND CABLE WITH SENSOR

(71) Applicant: Hitachi Metals, Ltd., Tokyo (JP)

(72) Inventors: Kazuhiko Tomita, Tokyo (JP); Takashi Onimoto, Tokyo (JP); Masaaki Imahori, Tokyo (JP)

(73) Assignee: HITACHI METALS, LTD., Tokyo (JP)

( * ) Notice: Subject to any disclaimer, the term of this patent is extended or adjusted under 35 U.S.C. 154(b) by 143 days.

(21) Appl. No.: 16/409,448

(22) Filed: May 10, 2019

(65) Prior Publication Data

US 2019/0368896 A1 Dec. 5, 2019

(30) Foreign Application Priority Data

May 31, 2018 (JP) .............................. JP2018-104547

(51) Int. Cl.
| | |
|---|---|
| *G01D 5/14* | (2006.01) |
| *B60T 8/171* | (2006.01) |
| *G01R 33/00* | (2006.01) |
| *G01P 3/487* | (2006.01) |
| *G01R 33/07* | (2006.01) |
| *H01B 9/00* | (2006.01) |

(52) U.S. Cl.
CPC .............. *G01D 5/145* (2013.01); *B60T 8/171* (2013.01); *G01P 3/487* (2013.01); *G01R 33/0047* (2013.01); *G01R 33/07* (2013.01); *H01B 9/003* (2013.01)

(58) Field of Classification Search
CPC ..... G01D 5/145; G01R 33/0047; H01B 9/003
See application file for complete search history.

(56) References Cited

U.S. PATENT DOCUMENTS

| 4,614,111 | A | * | 9/1986 | Wolff | .................... | F02M 65/005 |
|---|---|---|---|---|---|---|
| | | | | | | 29/595 |
| 5,134,371 | A | * | 7/1992 | Watanabe | .............. | G01R 33/09 |
| | | | | | | 324/252 |
| 5,302,893 | A | * | 4/1994 | Yoshimura | ................ | G01D 5/12 |
| | | | | | | 324/174 |

(Continued)

FOREIGN PATENT DOCUMENTS

JP 2009-052936 A 3/2009

*Primary Examiner* — Paresh Patel
(74) *Attorney, Agent, or Firm* — McGinn I.P. Law Group, PLLC.

(57) ABSTRACT

A magnetic detection sensor for being installed at an end of a cable with a pair of signal wires to detect a magnetic field from magnetic poles. The sensor includes a magnetic sensor including a detection section and a pair of lead frames, the detection section including a magnetic detection element for detecting the magnetic field from the magnetic poles, and the lead frames extending from the detection section and configured to output a detection signal of the detection section, a housing portion that houses the magnetic sensor, and a capacitor that is provided separately from the magnetic sensor and is housed in the housing portion. First joining portions respectively joining the pair of lead frames to the pair of signal wires and second joining portions respectively joining the pair of lead frames to a pair of lead wires of the capacitor are located inside the housing portion.

20 Claims, 8 Drawing Sheets

(56) References Cited

U.S. PATENT DOCUMENTS

| | | | | |
|---|---|---|---|---|
| 5,451,868 A | * | 9/1995 | Lock | G01P 1/026 |
| | | | | 324/166 |
| 7,026,910 B2 | * | 4/2006 | Apel | B82Y 25/00 |
| | | | | 338/32 R |
| 7,385,394 B2 | * | 6/2008 | Auburger | G01P 3/488 |
| | | | | 324/207.25 |
| 10,060,770 B2 | * | 8/2018 | Goll | G01D 11/245 |
| 2004/0135574 A1 | * | 7/2004 | Hagio | G01D 5/145 |
| | | | | 324/207.25 |
| 2007/0126088 A1 | * | 6/2007 | Frazee | H01L 23/49575 |
| | | | | 257/666 |
| 2011/0175598 A1 | * | 7/2011 | Doering | B29C 45/14655 |
| | | | | 324/160 |

* cited by examiner

MAGNETIC DETECTION SENSOR, ROTATION DETECTION SENSOR, AND CABLE WITH SENSOR

CROSS-REFERENCE TO RELATED APPLICATIONS

The present application is based on Japanese patent application No. 2018-104547 filed on May 31, 2018, the entire contents of which are incorporated herein by reference.

BACKGROUND OF INVENTION

1. Field of Invention

The invention relates to a magnetic detection sensor, a rotation detection sensor, and a cable with sensor.

2. Description of Related Art

Rotation detection device used on, e.g., a bearing unit of a wheel to detect a rotational speed of a rotating member rotating with the wheel is known. For example, a device known as such rotation detection device is provided with a member to be detected which has plural magnetic poles along a circumferential direction of the rotating member, and a rotation detection sensor which is attached to a non-rotating member so as to face the member to be detected and detects a magnetic field of the member to be detected.

It is known that some rotation detection sensors use a magnetic sensor which has a plate-shaped detection section having a magnetic detection element for detecting a magnetic field from the member to be detected, a signal processing circuit for processing a signal output from the magnetic detection element, and a cover covering the magnetic detection element as well as the signal processing circuit.

JP 2009/52936 A discloses a rotation detection sensor in which a noise prevention capacitor is mounted on a magnetic sensor.

SUMMARY OF INVENTION

It is desirable to select a noise prevention capacitor of which capacitance is appropriate in relation to the external noise level. In case of the rotation detection sensor disclosed in JP 2009/52936 A, however, it is not easy to adjust the capacitance since the noise prevention capacitor is incorporated in the detection section.

It is an object of the invention to provide a magnetic detection sensor, a rotation detection sensor and a cable with sensor that are each provided with a noise prevention capacitor whose capacitance can be easily adjusted.

According to an embodiment of the invention, a magnetic detection sensor for being installed at an end of a cable with a pair of signal wires to detect a magnetic field from magnetic poles comprises:
- a magnetic sensor comprising a detection section and a pair of lead frames, the detection section comprising a magnetic detection element for detecting the magnetic field from the magnetic poles, and the lead frames extending from the detection section and configured to output a detection signal of the detection section;
- a housing portion that houses the magnetic sensor; and
- a capacitor that is provided separately from the magnetic sensor and is housed in the housing portion,
- wherein first joining portions respectively joining the pair of lead frames to the pair of signal wires and second joining portions respectively joining the pair of lead frames to a pair of lead wires of the capacitor are located inside the housing portion.

According to another embodiment of the invention, a rotation detection sensor for being installed at an end of a cable with a pair of signal wires and attached to a non-rotating member not rotating upon rotation of a rotating member to detect a rotation of the rotating member by detecting a magnetic field from magnetic poles rotating with the rotating member comprises:
- a magnetic sensor comprising a detection section and a pair of lead frames, the detection section comprising a magnetic detection element for detecting the magnetic field from the magnetic poles, and the lead frames extending from the detection section and being used to output a detection signal of the detection section;
- a housing portion that houses the magnetic sensor; and
- a capacitor that is provided separately from the magnetic sensor and is housed in the housing portion,
- wherein first joining portions respectively joining the pair of lead frames to the pair of signal wires and second joining portions respectively joining the pair of lead frames to a pair of lead wires of the capacitor are located inside the housing portion.

According to another embodiment of the invention, a cable with sensor comprises:
- a cable comprising a pair of signal wires; and
- a rotation detection sensor that is installed at an end of the cable and attached to a non-rotating member not rotating upon rotation of a rotating member to detect a rotation of the rotating member by detecting a magnetic field from magnetic poles rotating with the rotating member,
- wherein the rotation detection sensor comprises:
- a magnetic sensor comprising a detection section and a pair of lead frames;
- a housing portion housing the magnetic sensor; and
- a capacitor,
- wherein the detection section comprises a magnetic detection element for detecting the magnetic field from the magnetic poles,
- wherein the lead frames extend from the detection section and are configured to output a detection signal of the detection section,
- wherein the capacitor is provided separately from the magnetic sensor and housed in the housing portion, and
- wherein first joining portions respectively joining the pair of lead frames to the pair of signal wires and second joining portions respectively joining the pair of lead frames to a pair of lead wires of the capacitor are located inside the housing portion.

Effects of Invention

According to an embodiment of the invention, a magnetic detection sensor, a rotation detection sensor and a cable with sensor can be provided that are each provided with a noise prevention capacitor whose capacitance can be easily adjusted.

BRIEF DESCRIPTION OF THE DRAWINGS

FIGS. 6A and 6B are diagrams illustrating a cable with sensor in a modification of the invention, wherein FIG. 6A is a schematic showing a structure and FIG. 6B is a cross sectional view showing a cable.

FIGS. 7A and 7B are diagrams illustrating a rotation detection sensor in a modification of the invention, wherein FIG. 7A is a perspective view showing an outer appearance and FIG. 7B is a perspective view based on FIG. 7A and showing the state in which the housing portion is omitted.

DETAILED DESCRIPTION OF THE PREFERRED EMBODIMENTS

Embodiment

An embodiment of the invention will be described below in conjunction with the appended drawings.

Figure 1:
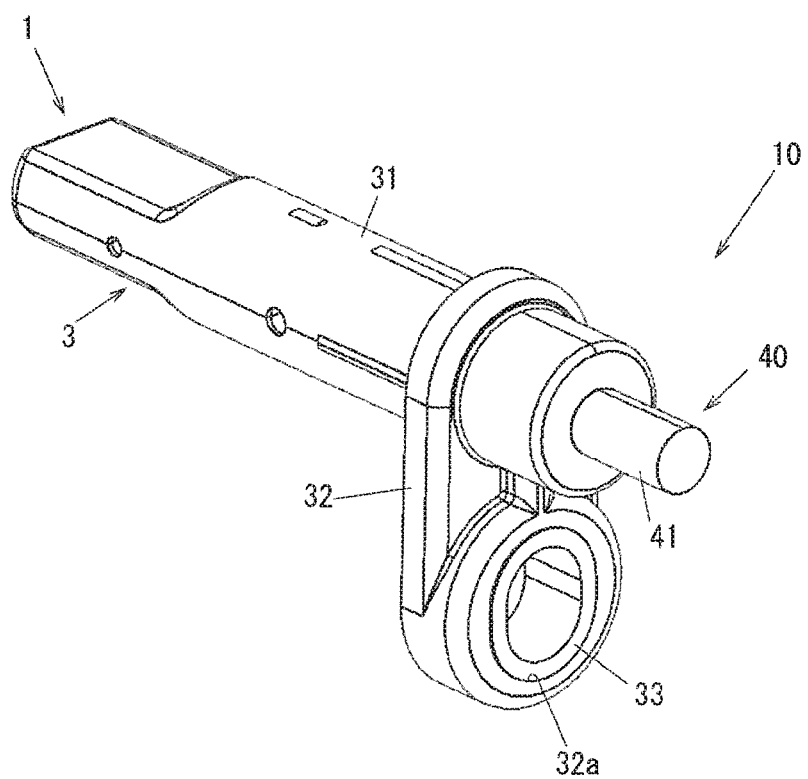
FIG. 1 is a perspective view showing an outer appearance of a rotation detection sensor in an embodiment of the present invention.
Figure 2:
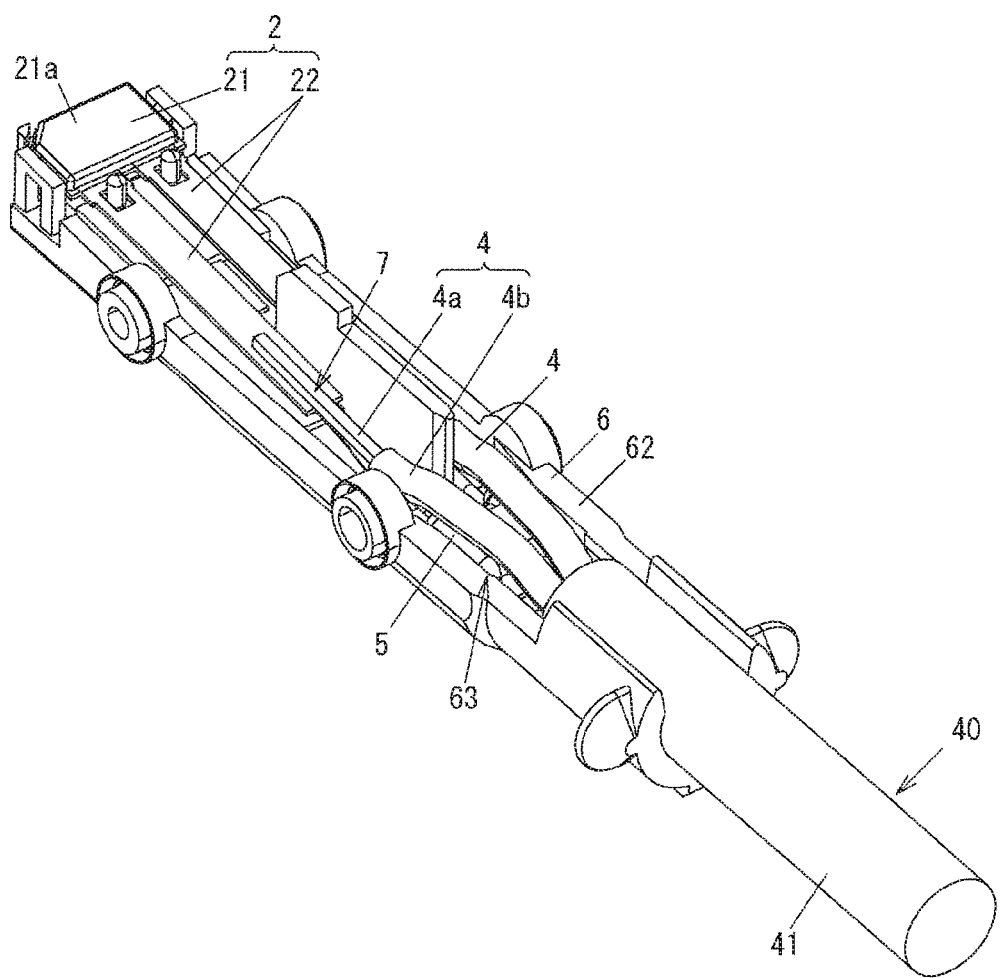
FIG. 2 is a perspective view based on FIG. 1 and showing the state in which a housing portion is omitted.
Figure 3A:
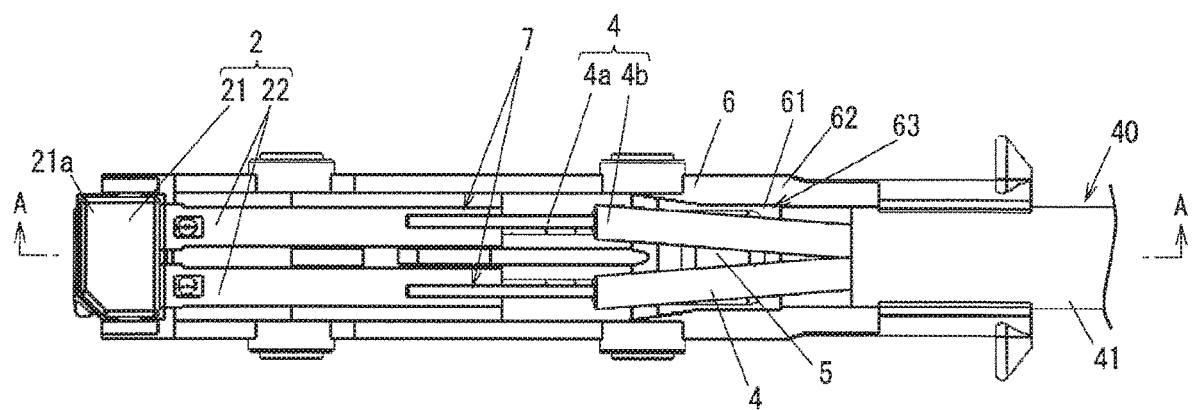
FIG. 3A is a plan view of FIG. 2.
Figure 3B:
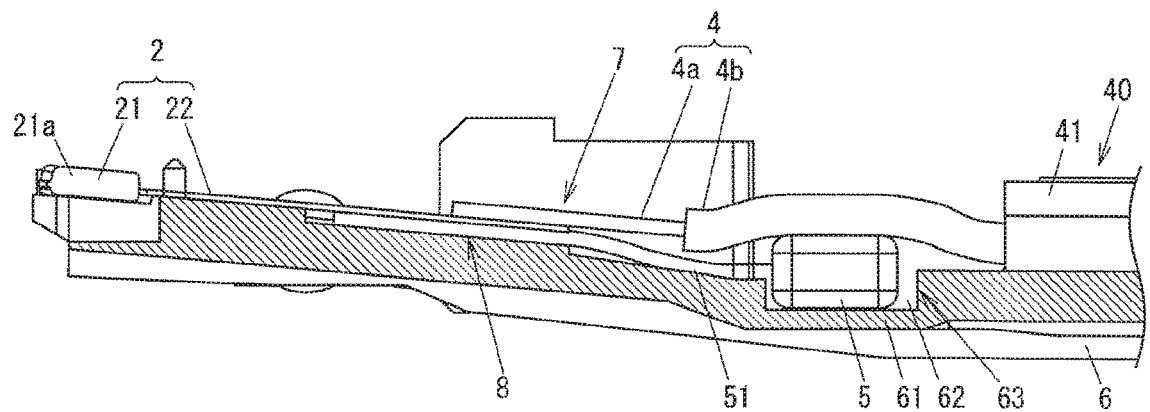
FIG. 3B is a cross sectional view taken along a line A-A in FIG. 3A.
Figure 4A:
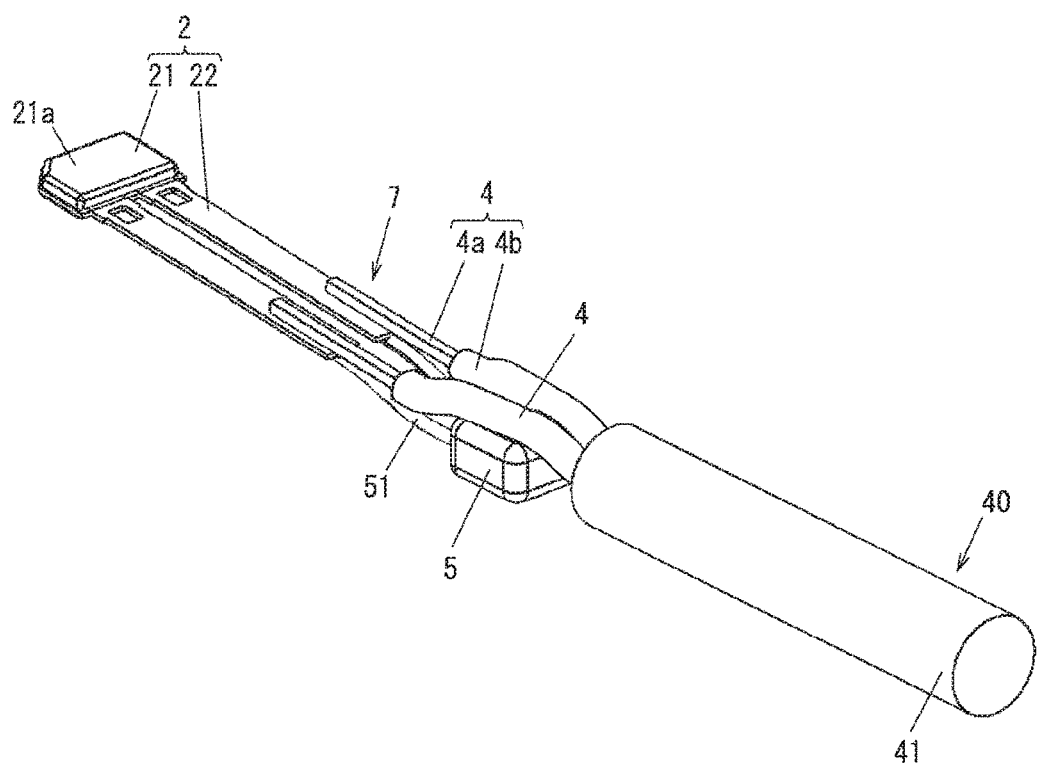
FIG. 4A is a perspective view based on FIG. 2 and showing the state in which a holder is further omitted.
Figure 4B:
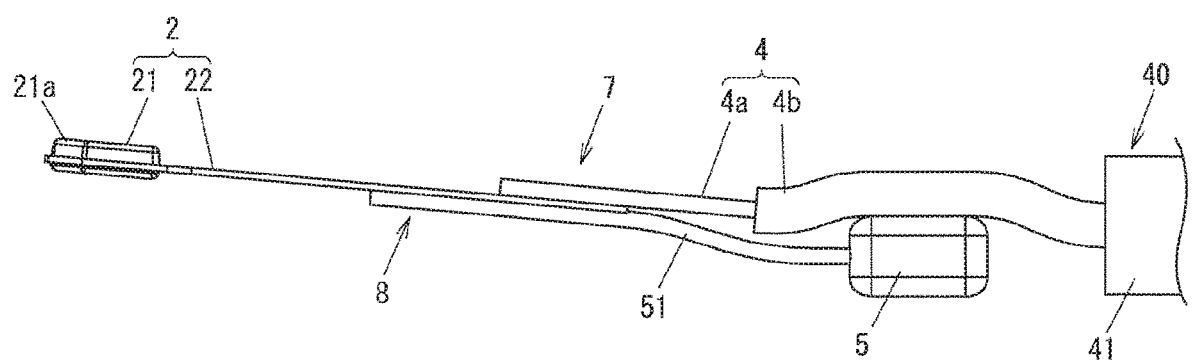
FIG. 4B is a side view of FIG. 4A.
Figure 5A:
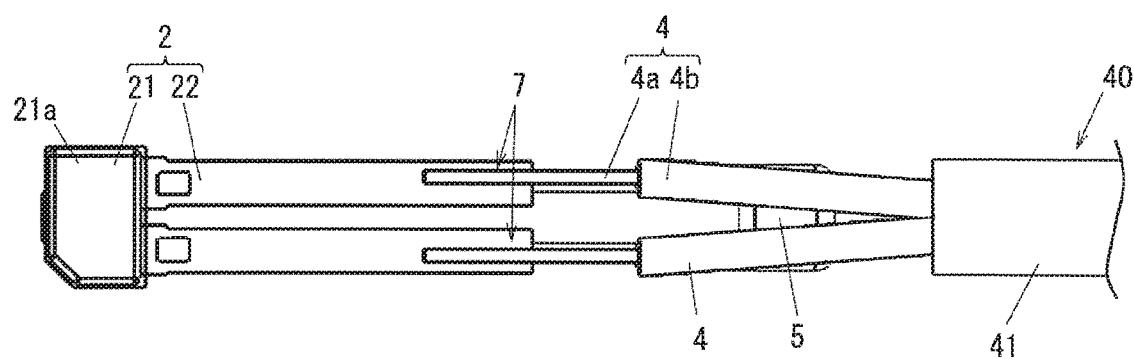
FIG. 5A is a plan view of FIG. 4 when viewed from the signal wire side.
Figure 5B:
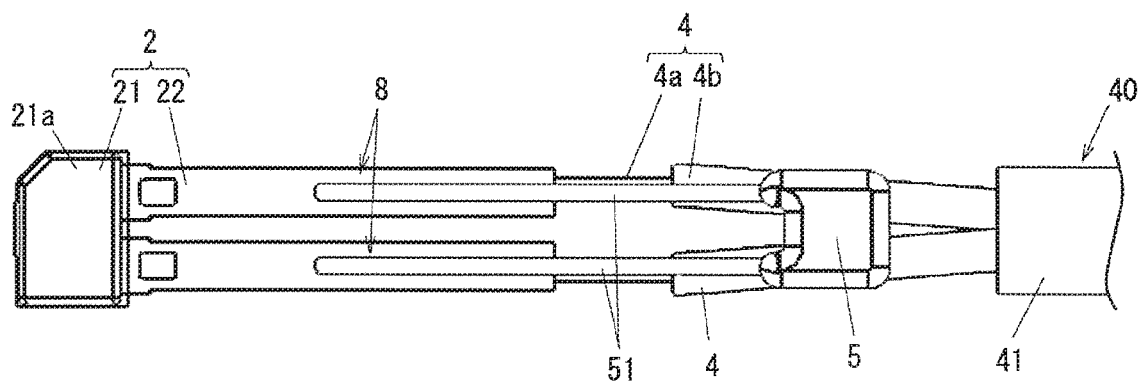
FIG. 5B is another plan view of FIG. 4 when viewed from the capacitor side.

FIG. 1 is a perspective view showing an outer appearance of a rotation detection sensor in the present embodiment. FIG. 2 is a perspective view based on FIG. 1 and showing the state in which a housing portion is omitted, FIG. 3A is a plan view of FIG. 2 and FIG. 3B is a cross sectional view taken along the line A-A in FIG. 3A. FIG. 4A is a perspective view based on FIG. 2 and showing the state in which a holder is further omitted and FIG. 4B is a side view of FIG. 4A. FIG. 5A is a plan view of FIG. 4 when viewed from the signal wire side and FIG. 5B is another plan view of FIG. 4 when viewed from the capacitor side A rotation detection sensor 1 is attached to a non-rotating member not rotating with rotation of a rotating member and detects rotation of the rotating member by detecting a magnetic field from magnetic poles which rotate with the rotating member. The rotation detection sensor 1 in the present embodiment is mounted on an automobile and is used to detect a rotational speed of a wheel (wheel speed). In this case, a member to be detected which has plural magnetic poles arranged in a circumferential direction about a rotational axis thereof is provided on the wheel (inner race) which is the rotating member. The rotation detection sensor 1 is attached to the non-rotating member such as knuckle so as to face the member to be detected in a radial direction (radial about the rotational axis).

As shown in FIGS. 1 to 5, the rotation detection sensor 1 is provided at an end of a cable 40 having a pair of signal wires 4, and is provided with a magnetic sensor 2, a housing portion 3, and a capacitor 5. A device provided with the cable 40 and the rotation detection sensor 1 is a cable with sensor 10 in the present embodiment.

The magnetic sensor 2 has a detection section 21 and a pair of lead frames (connection terminals) 22 extending from the detection section 21. The detection section 21 has a magnetic detection element (not shown) for detecting a magnetic field from the magnetic poles attached to the rotating member, a signal processing circuit (not shown) for processing a signal output from the magnetic detection element, and a resin mold 21a collectively covering the magnetic detection element and the signal processing circuit. The detection section 21 is formed in a substantially rectangular plate shape (a rectangular shape in which one of four corners is chamfered) in a plan view. The detection axis of the magnetic detection element (a magnetic field detecting direction) is the vertical direction in FIG. 3A (a direction of a tangent to a circle having a center on the rotational axis line of the rotating member). As the magnetic sensor 2, it is possible to use, e.g., a Hall element, a GMR (Giant Magneto-Resistive) element and a TMR (Tunneling Magneto-Resistive) element, etc.

The pair of lead frames 22 are used to output a detection signal of the detection section 21 (an output signal from the signal processing circuit) and extend from one long side of the detection section 21 (a long side not connected to the chamfered corner) in a direction perpendicular to the long side. The two lead frames 22 are formed parallel to each other. In the present embodiment, the both lead frames 22 are formed in a plate shape (strip shape). The both lead frames 22 are substantially parallel to the detection section 21.

Each of the pair of signal wires 4 has a center conductor 4a constructed from a stranded conductor formed by twisting highly conductive strands of copper, etc., and an insulation 4b formed of an insulating resin such as cross-linked polyethylene and covering the outer surface of the center conductor 4a. The pair of signal wires 4 are covered with a single sheath 41. The cable 40 is formed by covering the pair of signal wires 4 with the sheath 41.

The pair of signal wires 4 are exposed from the sheath 41 at an end of the cable 40, and the center conductors 4a are further exposed from the insulations 4b at an end of the signal wires 4. The center conductor 4a exposed from the insulation 4b is joined and electrically connected to the corresponding lead frame 22 of the magnetic sensor 2 by resistance welding. Portions respectively joining the pair of lead frames 22 to the pair of signal wires 4 (the center conductors 4a) are referred to as first joining portions 7. The details of the first joining portion 7 will be described later.

The capacitor 5 is a capacitive element for preventing noise. In the present embodiment, the capacitor 5 is provided separately from the magnetic sensor 2. The capacitor 5 has a pair of lead wires 51, and the both lead wires 51 are joined and electrically connected to the respective corresponding lead frames 22 of the magnetic sensor 2 by resistance welding. Portions respectively joining the pair of lead frames 22 to the pair of lead wires 51 are referred to as second joining portions 8. The details of the second joining portion 8 will be described later.

The housing portion 3 is obtained by integrally forming a substantially cylindrical main body 31 and a flange 32. The main body 31 covers the magnetic sensor 2, an end of the cable 40 (end portions of the pair of signal wires 4) and the capacitor 5. The flange 32 is provided to fix the rotation detection sensor 1 to the non-rotating member. An end portion of the sheath 41 of the cable 40 is covered with the main body 31 inside which the signal wires 4 extend out of the sheath 41. A bolt hole 32a for inserting a fixing bolt (not shown) is formed on the flange 32. In the bolt hole 32a, a cylindrical metal collar 33 is provided along the inner circumferential surface of the bolt hole 32a so that deformation of the flange 32 at the time of bolt fixation can be prevented.

The housing portion 3 is formed by molding a resin. In the present embodiment, a holder 6 is provided so that the magnetic sensor 2 and the capacitor 5 can be held on a molding die and protected during resin molding.

The holder 6 has a recess-shaped capacitor-housing space 63 surrounded by a bottom wall 61 and side walls 62, and the capacitor 5 is housed in the capacitor-housing space 63. In the present embodiment, the capacitor 5 is arranged on the bottom wall 61 of the holder 6 and the pair of signal wires 4 are arranged on the capacitor 5. In other words, in the present embodiment, the capacitor 5 and the pair of signal wires 4 are stacked one above the other (stacked in a direction orthogonal to the bottom wall 61) on the holder 6. The pair of signal wires 4 are arranged side by side in a direction parallel to the bottom wall 61. This configuration prevents the capacitor 5 from being damaged by heat of the resin during resin molding.

It is possible to use the housing portion 3 formed of, e.g., PA (polyamide) 612 grade, Nylon 66 (Nylon is a registered trademark), or PBT (polybutylene terephthalate), etc. Alternatively, the housing portion 3 can be formed of a resin containing glass filler, etc. The holder 6 is preferably formed of the same material (a material consisting of the same principal components) as the housing portion 3 so that the holder 6 is integrated with the housing portion 3 at the time of molding the resin.

First Joining Portion 7 and Second Joining Portion 8

In the rotation detection sensor 1 of the present embodiment, the capacitor 5 for noise prevention is provided separately from the magnetic sensor 2, and the first joining portions 7 respectively joining the pair of lead frames 22 to the pair of signal wires 4 and the second joining portions 8 respectively joining the pair of lead frames 22 to the pair of lead wires 51 of the capacitor 5 are located inside the housing portion 3.

Providing the noise prevention capacitor 5 separately from the magnetic sensor 2 allows the capacitance of the capacitor 5 to be easily changed according to the intended use (i.e., the external noise level in the usage environment). When the noise prevention capacitor 5 is integrally mounted on the magnetic sensor 2 in the known manner, it is necessary to select the magnetic sensor 2 which mounts the capacitor 5 with a capacitance appropriate for the intended use, and in some cases, it is necessary to custom-order the magnetic sensor 2, causing an increase in cost. When the capacitor 5 is provided separately from the magnetic sensor 2 as in the present embodiment, it is possible to easily change the capacitance of the capacitor 5. Thus, the heretofore used magnetic sensor 2 can be used as-is regardless of the usage environment, allowing for cost reduction. In addition, it is possible to improve noise resistance by selecting an appropriate capacitance.

When the capacitor 5 is provided separately from the magnetic sensor 2, it is necessary to avoid an impact of heat during when molding the resin to form the housing portion 3. In this regard, the degree of freedom of the arrangement position of the capacitor 5 inside the housing portion 3 can be increased by appropriately adjusting the length of the lead wires 51 of the capacitor 5. In other words, by appropriately adjusting the length of the lead wires 51 so that the capacitor 5 can be housed in the capacitor-housing space 63 in which direct exposure to the molten resin is avoided during resin molding, it is possible to prevent damage, etc., on the capacitor 5.

In the present embodiment, each of the pair of lead frames 22 is formed in a plate shape (a strip shape), as described above. The first joining portions 7 are provided on one side (the front surfaces) of the lead frames 22 and the second joining portions 8 are provided on the other side (the back surfaces) of the lead frames 22. That is, the signal wires 4 (the center conductors 4a) are joined to the lead frames 22 on one side and the capacitor 5 (the lead wires 51) is joined on the other side. As a result, a space for all joining portions can be smaller than when both the signal wires 4 and the capacitor 5 are joined on one side of the lead frames 22, contributing to size reduction of the rotation detection sensor 1. Since the capacitor 5 is housed in the capacitor-housing space 63 in the present embodiment, the second joining portions 8 are arranged on the bottom wall 61 side of the capacitor-housing space 63.

In addition, in the present embodiment, the first joining portion 7 and the second joining portion 8 are positioned without overlapping in a length direction of the lead frame 22. When joining by resistance welding, it is necessary to arrange electrodes so that members to be joined are sandwiched therebetween. If the first joining portion 7 and the second joining portion 8 overlap in the length direction of the lead frame 22, it is difficult to arrange the electrodes. By configuring so that the first joining portion 7 and the second joining portion 8 do not overlap in the length direction of the lead frame 22, work of joining the signal wires 4 can be performed separately from work of joining the lead wires 51, which improves workability and productivity.

In the present embodiment, the first joining portions 7 are provided at tips (end portions opposite to the detection section 21) of the lead frames 22, and the second joining portions 8 are provided on the proximal end side (on the detection section 21 side) with respect to the first joining portions 7. In the present embodiment, the capacitor-housing space 63 is provided on the side where the cable 40 extends out with respect to the second joining portions 8, and the lead wires 51 of the capacitor 5 thus extend from the second joining portions 8 toward the first joining portions 7. Thus, during the joining work, the first joining portions 7 are firstly formed by joining the center conductors 4a of the signal wires 4 to the front surfaces of the lead frames 22, and the second joining portions 8 are then formed by joining the lead wires 51 of the capacitor 5 to the back surfaces of the lead frames 22.

Modification of the Cable With Sensor

Although the cable 40 in the embodiment is formed by collectively covering a pair of signal wires 4 with the sheath 41, it is not limited thereto. The cable 40 may contain electric wires other than the signal wires 4 for the rotation detection sensor 1.

Figure 6A:
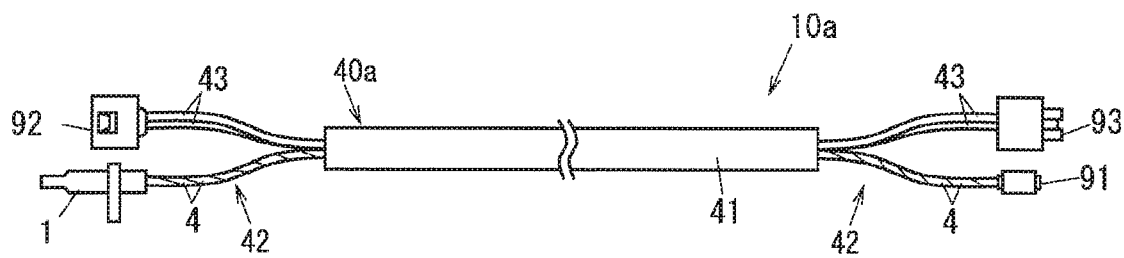
Figure 6B:
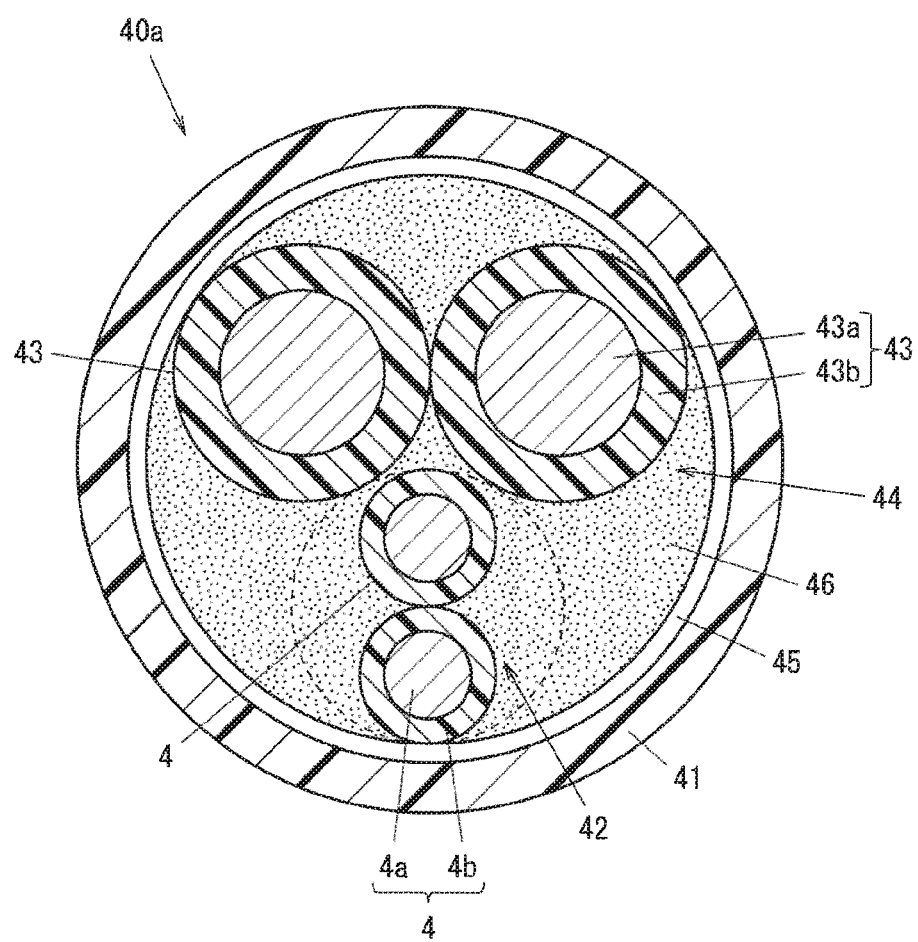
Figure 7A:
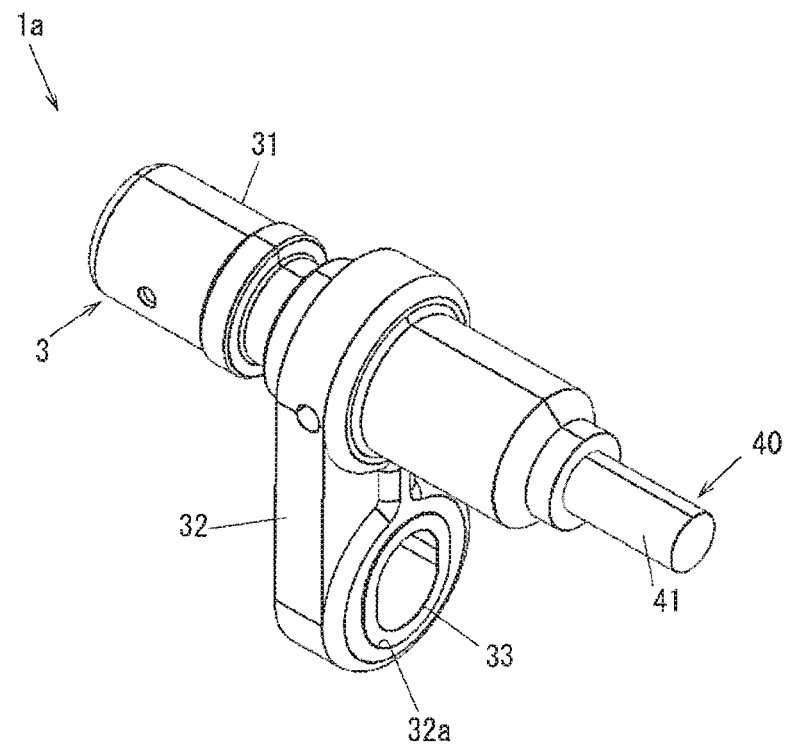
Figure 7B:
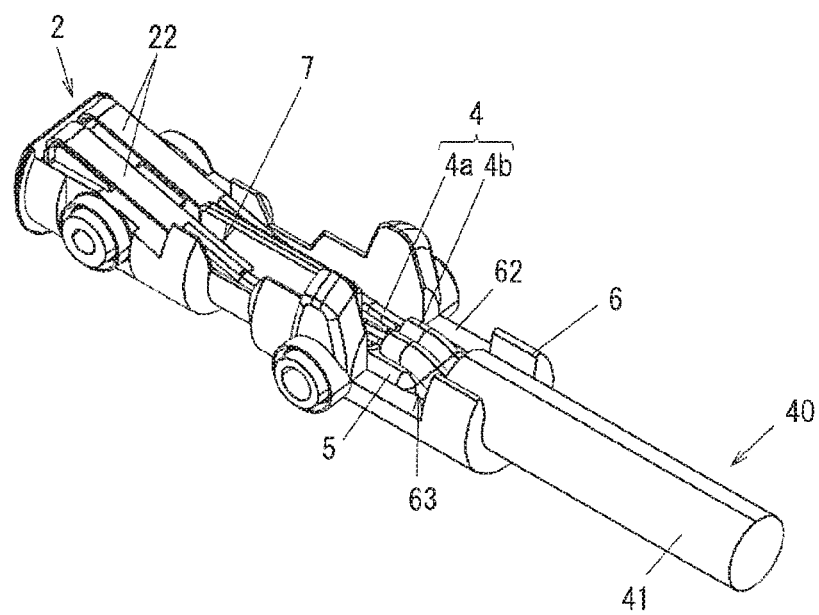
Figure 8A:
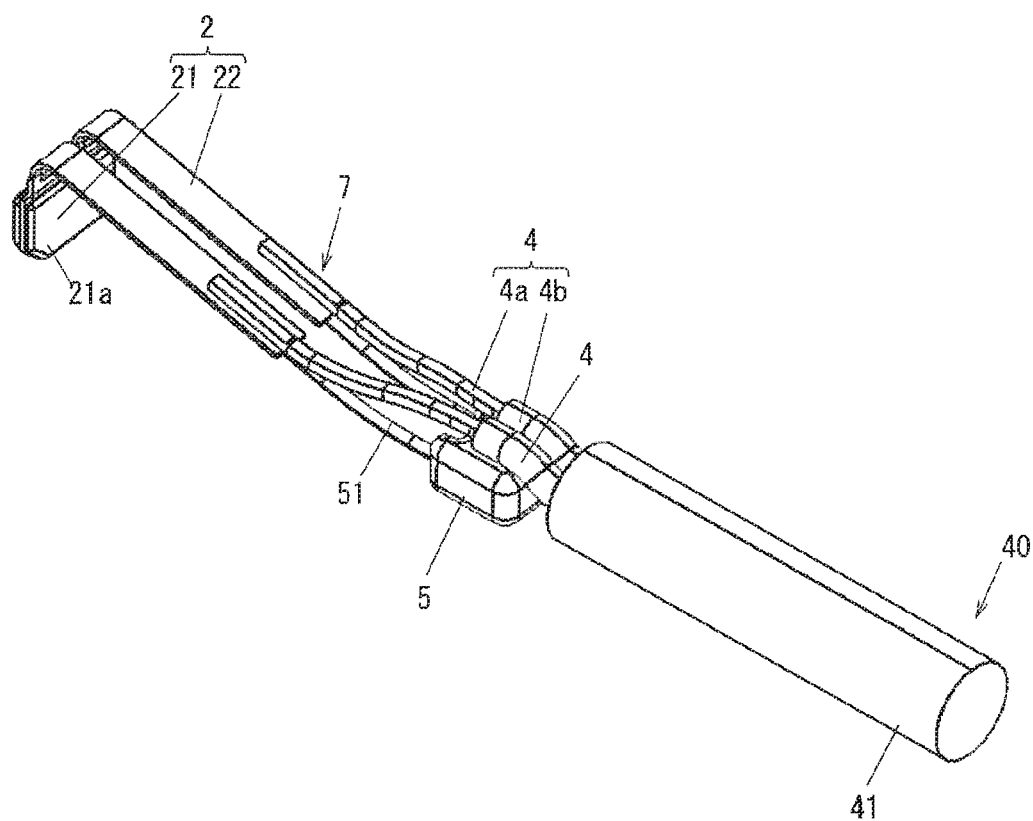
FIGS. 8A and 8B are perspective views based on FIG. 7B and showing the state in which the holder is further omitted.
Figure 8B:
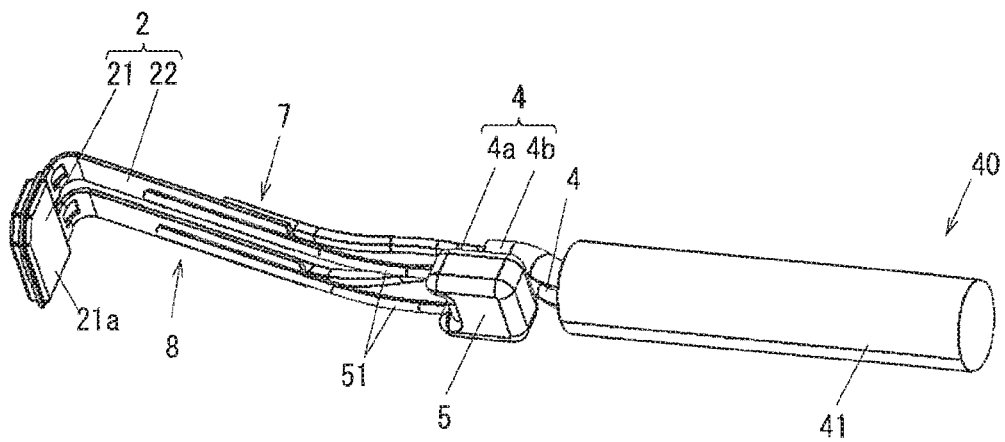

For example, in a cable with sensor 10a shown in FIGS. 6A and 6B, a cable 40a is provided with a twisted-pair wire 42 formed by twisting a pair of signal wires 4, a pair of power wires 43 having larger outer diameter and conductor cross-sectional area than the signal wire 4, a tape member 45 spirally wound around an assembled article 44 which is formed by twisting the twisted-pair wire 42 and the power wires 43 together, and the sheath 41 covering the outer surface of the tape member 45.

The rotation detection sensor 1 is provided at one end of the twisted-pair wire 42. A vehicle body-side sensor connector 91 for connection to a wire group inside a junction box provided on a body of a vehicle is attached to the other end of the twisted-pair wire 42.

In the present embodiment, the power wires 43 are used for supplying a drive current to a motor (not shown) for an electric parking brake (hereinafter, referred to as "EPB") mounted on a wheel of a vehicle.

EPB is an electric brake system configured to output a drive current to the motor for a predetermined period of time (e.g., for 1 second) when a parking brake activation switch is turned from an OFF state to an ON state during the stationary state of the vehicle so that brake pads are pressed against a disc rotor of the wheel and a braking force to be applied to the wheel is generated. The EPB is also configured to output a drive current to the motor when the parking brake activation switch is turned from the ON state to the OFF state or when an accelerator pedal is depressed so that the brake pads move away from the disc rotor of the wheel and the braking force on the wheel is released. That is, an operating state of the EPB is maintained from when the parking brake activation switch is turned on to when the parking brake activation switch is turned off or the accelerator pedal is depressed.

The power wire 43 has a power wire center conductor 43a and a power wire insulation 43b covering the power wire center conductor 43a. The power wire center conductor 43a is constructed from a stranded conductor formed by twisting highly conductive strands of copper, etc., and the power wire insulation 43b is formed of an insulating resin such as cross-linked polyethylene. A wheel-side power connector 92 for connection to the EPB motor is attached to one end of the pair of power wires 43, and a vehicle body-side power connector 93 for connection to the wire group inside the junction box is attached to the other end of the pair of power wires 43.

In the EPB, a drive current is supplied to the motor basically when the vehicle is stationary. On the other hand, the rotation detection sensor 1 is used when the vehicle is in motion and the rotation detection sensor 1 is not used during when the drive current is supplied through the power wires 43. Therefore, in the present embodiment, a shield conductor around the power wires 43 or the twisted-pair wire 42 is omitted. Omitting the shield conductor allows the cable 40a to have a smaller outer diameter than when providing the shield conductor and also reduces the number of components, thereby reducing the cost.

Plural thread-like (fibrous) fillers 46 extending in the longitudinal direction of the cable 40a are arranged between the twisted-pair wire 42/the power wires 43 and the tape member 45. In the present embodiment, the assembled article 44 is formed by twisting the fillers 46 together with the twisted-pair wire 42 and the power wires 43. Thus, a cross sectional shape after winding the tape member 45 around the assembled article 44 can be closer to a circle. As the filler 46, it is possible to use a fibrous material such as polypropylene yarn, staple fiber yarn (rayon staple fiber), aramid fiber, nylon fiber or fiber plastic, a paper or a cotton yarn.

The tape member 45 is spirally wound around the assembled article 44. The tape member 45 is in contact with all electric wires (the pair of signal wires 4 and the pair of power wires 43) covered with the tape member 45. The tape member 45 is interposed between the assembled article 44 and the sheath 41 and serves to reduce friction between the assembled article 44 (the signal wires 4 and the power wires 43) and the sheath 41 when being bent. In other words, providing the tape member 45 can reduce friction between the signal wires 4/the power wires 43 and the sheath 41 without using a lubricant such as talc powder, and thus reduces stress applied to the signal wires 4 and the power wires 43 when being bent, and it is thereby possible to improve flex resistance.

It is desirable to use the tape member 45 which is slidable (has a low friction coefficient) with respect to the insulation 4b of the signal wire 4 or the power wire insulation 43b of the power wire 43, and it is possible to use the tape member 45 formed of, e.g., a non-woven fabric, paper, or resin (resin film, etc.). The tape member 45 is spirally wound around the assembled article 44 so as to overlap at a portion in a width direction (a direction perpendicular to the longitudinal direction and thickness direction of the tape member 45). The overlapping portion of the tape member 45 is not adhered by an adhesive, etc.

Modification of the Magnetic Sensor

Although the lead frames 22 extending parallel to the detection section 21 has been described in the embodiment, it is not limited thereto. The lead frames 22 may be bent appropriately. For example, the lead frames 22 may be bent at substantially right angle at the proximal ends thereof (the end portions on the detection section 21 side) as in a rotation detection sensor 1a shown in FIGS. 7A, 7B, 8A and 8B. The length of the entire rotation detection sensor 1 can be reduced in this configuration, realizing the rotation detection sensor 1a having a smaller size.

Functions and Effects of the Embodiment

As described above, the rotation detection sensor 1 in the present embodiment is configured that the noise prevention capacitor 5 is provided separately from the magnetic sensor 2 and is housed in the housing portion 3, and the first joining portions 7 respectively joining the pair of lead frames 22 to the pair of signal wires 4 and the second joining portions 8 respectively joining the pair of lead frames 22 to the pair of lead wires 51 of the capacitor 5 are located inside the housing portion 3.

This configuration allows the capacitance of the noise prevention capacitor 5 to be easily adjusted according to the external noise level in the usage environment, hence, the rotation detection sensor 1 with high characteristics against external noise can be realized at low cost.

Summary of the Embodiments

Technical ideas understood from the embodiment will be described below citing the reference numerals, etc., used for the embodiment. However, each reference numeral, etc., described below is not intended to limit the constituent elements in the claims to the members, etc., specifically described in the embodiment.

[1] A magnetic detection sensor (1) for being installed at an end of a cable (40) with a pair of signal wires (4) to detect a magnetic field from magnetic poles, the magnetic detection sensor (1) comprising: a magnetic sensor (2) comprising a detection section (21) and a pair of lead frames (22), the detection section (21) comprising a magnetic detection element for detecting the magnetic field from the magnetic poles, and the lead frames (22) extending from the detection section (21) and configured to output a detection signal of the detection section (21); a housing portion (3) that houses the magnetic sensor (2); and a capacitor (5) that is provided separately from the magnetic sensor (2) and is housed in the housing portion (3), wherein first joining portions (7) respectively joining the pair of lead frames (22) to the pair of signal wires (4) and second joining portions (8) respectively joining the pair of lead frames (22) to a pair of lead wires (51) of the capacitor (5) are located inside the housing portion (3).

[2] A rotation detection sensor (1) for being installed at an end of a cable (40) with a pair of signal wires (4) and attached to a non-rotating member not rotating upon rotation of a rotating member to detect a rotation of the rotating member by detecting a magnetic field from magnetic poles rotating with the rotating member, the rotation detection sensor (1) comprising: a magnetic sensor (2) comprising a detection section (21) and a pair of lead frames (22), the detection section (21) comprising a magnetic detection element for detecting the magnetic field from the magnetic poles, and the lead frames (22) extending from the detection section (21) and being used to output a detection signal of the detection section (21); a housing portion (3) that houses the magnetic sensor (2); and a capacitor (5) that is provided separately from the magnetic sensor (2) and is housed in the housing portion (3), wherein first joining portions (7) respectively joining the pair of lead frames (22) to the pair of signal wires (4) and second joining portions (8) respectively joining the pair of lead frames (22) to a pair of lead wires (51) of the capacitor (5) are located inside the housing portion (3).

[3] The rotation detection sensor (1) according to [2], wherein each of the pair of lead frames (22) is formed in a plate shape, the first joining portions (7) are provided on one side of the lead frames (22), and the second joining portions (8) are provided on the other side of the lead frames (22).

[4] The rotation detection sensor (1) according to [3], wherein the first joining portion (7) and the second joining portion (8) are positioned without overlapping in a length direction of the lead frame (22).

[5] A cable with sensor (10), comprising: a cable (40) comprising a pair of signal wires (4); and a rotation detection sensor (1) that is installed at an end of the cable (40) and attached to a non-rotating member not rotating upon rotation of a rotating member to detect a rotation of the rotating member by detecting a magnetic field from magnetic poles rotating with the rotating member, wherein the rotation detection sensor (1) comprises a magnetic sensor (2) comprising a detection section (21) and a pair of lead frames (22), a housing portion (3) housing the magnetic sensor (2), and a capacitor (5), the detection section (21) comprising a magnetic detection element for detecting the magnetic field from the magnetic poles, the lead frames (22) extending from the detection section (21) and being used to output a detection signal of the detection section (21), and the capacitor (5) being provided separately from the magnetic sensor (2) and housed in the housing portion (3), and first joining portions (7) respectively joining the pair of lead frames (22) to the pair of signal wires (4) and second joining portions (8) respectively joining the pair of lead frames (22) to a pair of lead wires (51) of the capacitor (5) are located inside the housing portion (3).

[6] The cable with sensor (10) according to [5], each of the pair of lead frames (22) is formed in a plate shape, the first joining portions (7) are provided on one side of the lead frames (22), and the second joining portions (8) are provided on the other side of the lead frames (22).

[7] The cable with sensor (10) according to [6], wherein the first joining portion (7) and the second joining portion (8) are positioned without overlapping in a length direction of the lead frame (22).

Although the embodiment of the invention has been described, the invention according to claims is not to be limited to the embodiment described above. Further, please note that all combinations of the features described in the embodiment are not necessary to solve the problem of the invention.

The invention can be appropriately modified and implemented without departing from the gist thereof. For example, although the rotation detection sensor 1 which detects a wheel speed has been described in the embodiment, it is not limited thereto. The invention is applicable to, e.g., a drive shaft sensor or a crank angle sensor, etc.

In addition, although a noise prevention capacitor is not provided on the detection section 21 of the magnetic sensor 2 in the embodiment, it is not limited thereto. A noise prevention capacitor may be provided on the detection section 21 of the magnetic sensor 2. In this case, the capacitor 5 which is provided separately from the magnetic sensor 2 serves to adjust the capacitance according to the external noise level.

The invention claimed is:

1. A magnetic detection sensor for being installed at an end of a cable with a pair of signal wires to detect a magnetic field from magnetic poles, the magnetic detection sensor comprising:
    a magnetic sensor comprising a detection section and a pair of lead frames, the detection section comprising a magnetic detection element for detecting the magnetic field from the magnetic poles, and the lead frames extending from the detection section and configured to output a detection signal of the detection section;
    a housing portion that houses the magnetic sensor; and
    a capacitor that is provided separately from the magnetic sensor and is housed in the housing portion,
    wherein first joining portions respectively joining the pair of lead frames to the pair of signal wires and second joining portions respectively joining the pair of lead frames to a pair of lead wires of the capacitor are located inside the housing portion, and
    wherein the pair of signal wires and the capacitor are stacked one above another in a direction orthogonal to an extending direction of the cable extending from the housing portion.

2. A rotation detection sensor for being installed at an end of a cable with a pair of signal wires and is attached to a non-rotating member not rotating upon a rotation of a rotating member to detect the rotation of the rotating member by detecting a magnetic field from magnetic poles rotating with the rotating member, the rotation detection sensor comprising:
    a magnetic sensor comprising a detection section and a pair of lead frames, the detection section comprising a magnetic detection element for detecting the magnetic field from the magnetic poles, and the lead frames extending from the detection section and being used to output a detection signal of the detection section;
    a housing portion that houses the magnetic sensor; and
    a capacitor that is provided separately from the magnetic sensor and is housed in the housing portion,
    wherein first joining portions, respectively joining the pair of lead frames to the pair of signal wires, and second joining portions, respectively joining the pair of lead frames to a pair of lead wires of the capacitor, are located inside the housing portion, and
    wherein the pair of signal wires and the capacitor are stacked one above another in a direction orthogonal to an extending direction of, the cable extending from the housing portion.

3. The rotation detection sensor according to claim 2, wherein each of the pair of lead frames is formed in a plate shape,
wherein the first joining portions are provided on one side of the lead frames, and
wherein the second joining portions are provided on another side of the lead frames.

4. The rotation detection sensor according to claim 3, wherein the first joining portion and the second joining portion are positioned without overlapping in a length direction of the lead frame.

5. A sensor cable with a sensor, the sensor cable comprising:
a cable comprising a pair of signal wires; and
a rotation detection sensor that is installed at an end of the cable and is attached to a non-rotating member not rotating upon a rotation of a rotating member to detect the rotation of the rotating member by detecting a magnetic field from magnetic poles rotating with the rotating member,
wherein the rotation detection sensor comprises:
a magnetic sensor comprising a detection section and a pair of lead frames;
a housing portion housing the magnetic sensor; and
a capacitor,
wherein the detection section comprises a magnetic detection element for detecting the magnetic field from the magnetic poles,
wherein the lead frames extend from the detection section and are configured to output a detection signal of the detection section,
wherein the capacitor is provided separately from the magnetic sensor and housed in the housing portion,
wherein first joining portions respectively joining the pair of lead frames to the pair of signal wires and second joining portions respectively joining the pair of lead frames to a pair of lead wires of the capacitor are located inside the housing portion, and
wherein the pair of signal wires and the capacitor are stacked one above another in a direction orthogonal to an extending direction of the cable extending from the housing portion.

6. The sensor cable with the sensor according to claim 5, wherein each of the pair of lead frames is formed in a plate shape, the first joining portions are provided on one side of the lead frames, and the second joining portions are provided on another side of the lead frames.

7. The sensor cable with the sensor according to claim 6, wherein the first joining portion and the second joining portion are positioned without overlapping in a length direction of the lead frame.

8. The magnetic detection sensor according to claim 1, wherein the magnetic poles are located outside of the magnetic detection sensor.

9. The magnetic detection sensor according to claim 1, wherein, in the direction orthogonal to the extending direction of the cable, the pair of signal wires overlap with the capacitor.

10. The magnetic detection sensor according to claim 1, wherein, in the direction orthogonal to the extending direction of the cable, the first joining portions and the second joining portions are disposed on opposing surfaces of the pair of lead frames.

11. The magnetic detection sensor according to claim 1, wherein the pair of signal wires abut an upper surface of the capacitor.

12. The rotation detection sensor according to claim 2, wherein the magnetic poles are located outside of the rotation detection sensor.

13. The rotation detection sensor according to claim 12, wherein the rotating member is located outside of the rotation detection sensor.

14. The rotation detection sensor according to claim 2, wherein, in the direction orthogonal to the extending direction of the cable, the pair of signal wires overlap with the capacitor.

15. The rotation detection sensor according to claim 2, wherein, in the direction orthogonal to the extending direction of the cable, the first joining portions and the second joining portions are disposed on opposing surfaces of the pair of lead frames.

16. The rotation detection sensor according to claim 2, wherein the pair of signal wires abut an upper surface of the capacitor.

17. The sensor cable with the sensor according to claim 5, wherein the magnetic poles and the rotating member are located outside of the sensor cable.

18. The sensor cable with the sensor according to claim 5, wherein, in the direction orthogonal to the extending direction of the cable, the pair of signal wires overlap with the capacitor.

19. The sensor cable with the sensor according to claim 5, wherein, in the direction orthogonal to the extending direction of the cable, the first joining portions and the second joining portions are disposed on opposing surfaces of the pair of lead frames.

20. The sensor cable with the sensor according to claim 5, wherein the pair of signal wires abut an upper surface of the capacitor.

* * * * *